United States Patent
Li et al.

(10) Patent No.: US 9,170,314 B2
(45) Date of Patent: Oct. 27, 2015

(54) METHOD AND MAGNETIC RESONANCE APPARATUS TO ACQUIRE MR DATA IN A PREDETERMINED THREE-DIMENSIONAL VOLUME SEGMENT OF A SUBJECT

(71) Applicants: Guo Bin Li, Freiburg (DE); Dominik Paul, Bubenreuth (DE)

(72) Inventors: Guo Bin Li, Freiburg (DE); Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 550 days.

(21) Appl. No.: 13/660,133

(22) Filed: Oct. 25, 2012

(65) Prior Publication Data

US 2013/0099785 A1    Apr. 25, 2013

(30) Foreign Application Priority Data

Oct. 25, 2011   (DE) .......................... 10 2011 085 148

(51) Int. Cl.
| | |
|---|---|
| *G01V 3/00* | (2006.01) |
| *G01R 33/483* | (2006.01) |
| *G01R 33/561* | (2006.01) |
| *G01R 33/565* | (2006.01) |

(52) U.S. Cl.
CPC ........ *G01R 33/4833* (2013.01); *G01R 33/5617* (2013.01); *G01R 33/56509* (2013.01)

(58) Field of Classification Search
CPC .................................................. G01R 33/4833
USPC ......................................................... 324/309
See application file for complete search history.

(56) References Cited

U.S. PATENT DOCUMENTS

| | | | | |
|---|---|---|---|---|
| 5,126,673 | A  * | 6/1992 | Hennig ........................ | 324/309 |
| 6,400,151 | B1 * | 6/2002 | Haase et al. ................. | 324/309 |
| 6,882,148 | B2 | 4/2005 | Pipe | |
| 2005/0237057 | A1 * | 10/2005 | Porter ........................... | 324/307 |
| 2011/0025325 | A1 | 2/2011 | Li et al. | |
| 2013/0033262 | A1 * | 2/2013 | Porter ........................... | 324/309 |
| 2013/0335077 | A1 * | 12/2013 | Paul .............................. | 324/307 |

OTHER PUBLICATIONS

J.R. Maclaren et al., "Rellis MRI: A Novel approach to motion correction", In: Proc. Intl. Soc. Magn. Reson. Med.; 14; 2006; p. 3194.

M.A. Bernstein et al., "Handbook of MRI pulse sequences"; Burlington, USA; Elsevier Academic Press; 2004; pp. 774-784; ISBN 0120928612.

* cited by examiner

*Primary Examiner* — Rodney Fuller
(74) *Attorney, Agent, or Firm* — Schiff Hardin LLP

(57) ABSTRACT

Acquisition of magnetic resonance (MR) data in a predetermined three-dimensional volume segment of an examination subject with an MR apparatus proceeds by the volume segment being excited with an RF excitation pulse, and repeated, temporally sequential implementation of the following in order to respectively read out an echo train:

Switch a refocusing pulse.

Switch a first phase coding gradient in a first direction and a second phase coding gradient in a second direction.

Switch an additional magnetic field gradient for spatial coding in a third direction which is perpendicular to the first direction and the second direction, wherein the MR data of a k-space line are read out while the additional magnetic field gradient is switched.

Every k-space line corresponds to a line of k-space that corresponds to the volume segment. At least one k-space line is read out repeatedly in a middle segment of k-space.

13 Claims, 6 Drawing Sheets

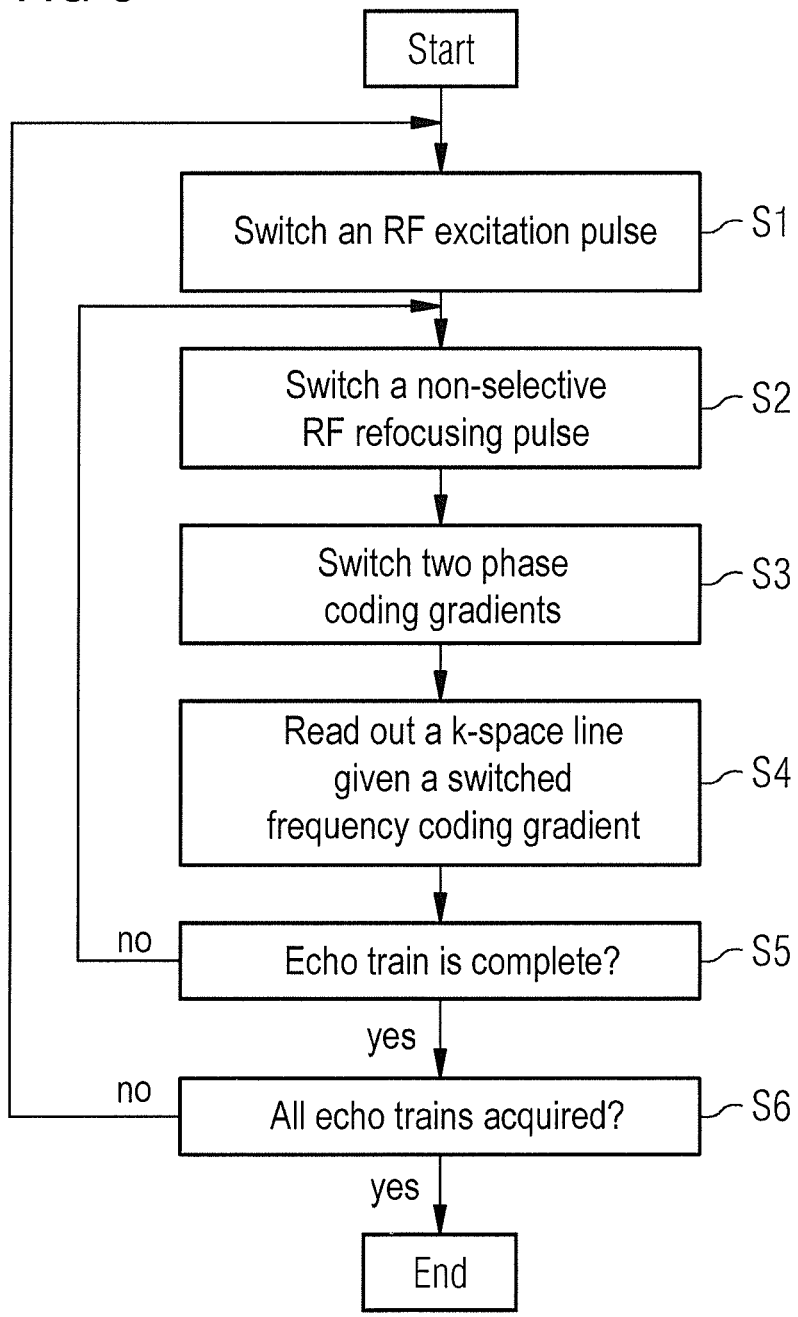

METHOD AND MAGNETIC RESONANCE APPARATUS TO ACQUIRE MR DATA IN A PREDETERMINED THREE-DIMENSIONAL VOLUME SEGMENT OF A SUBJECT

BACKGROUND OF THE INVENTION

1. Field of the Invention

The present invention concerns a method and a correspondingly designed magnetic resonance (MR) system in order to acquire MR data in a predetermined, three-dimensional volume segment.

2. Description of the Prior Art

MR methods according to the prior art with which data from a three-dimensional volume segment, are acquired, for example the SPACE sequence ("Sampling Perfection with Application optimized Contrasts using different flip angle Evolutions"), disadvantageously have a long acquisition time. Due to this long acquisition time, the MR data are often negatively affected by a movement of a patient during the data acquisition, which leads to movement artifacts in the MR data or in the reconstructed MR image.

SUMMARY OF THE INVENTION

An object of the present invention is to at least mitigate the effects of movement artifacts in this type of MR method in comparison to the prior art.

In accordance with the present invention, a method is provided to acquire MR data in a predetermined three-dimensional volume segment of an examination subject by means of a magnetic resonance system that includes the following steps:

The three-dimensional volume segment is excited with an RF excitation pulse. The RF excitation can thereby take place in a spatially selective or a non-spatially selective manner.

The following steps are implemented repeatedly in chronological succession in order to respectively read out an echo train:

Switch (activate) a refocusing pulse.

Switch (activate) a first phase coding gradient along a first direction and a second phase coding gradient along a second direction.

Switch (activate) an additional magnetic field gradient in a third direction which is perpendicular to the first direction and the second direction. The MR data of a k-space line are read out while the additional magnetic field gradient is switched (activated) (meaning that the k-space points of the k-space line are successively acquired while the additional magnetic field gradient is switched).

Every k-space line that is read out (i.e., has data values entered therein at respective data points of that line) while the additional magnetic field gradient is activated is a line of k-space that corresponds to the three-dimensional volume segment (with regard to frequency domain-to-spatial domain correspondence) to be acquired. K-space points of one or more k-space lines are acquired or read out repeatedly in a middle segment or central segment of k-space.

Movement artifacts can be detected and eliminated by the repeated acquisition of the same k-space points in the middle segment or center of k-space. For this, for example, the MR data that are scanned repeatedly for a specific k-space point are compared with averaged MR data which are created from all MR data acquired for this MR space point, and are discarded given too large a deviation from these averaged MR data. Because these discarded MR data are not taken into account in the reconstruction of the MR image, movement artifacts can accordingly be avoided.

However, it is also possible that the MR data which are scanned for a specific k-space point are only averaged, and the MR data of this specific k-space point that are averaged in such a manner are used in the reconstruction of the MR image. The MR data of the specific k-space point that are distorted by movement artifacts are essentially averaged out via this mean calculation and only slightly still affect the final or, respectively, averaged MR data of the specific k-space point.

The method according to the invention repeatedly acquires one or more k-space lines in the middle segment of k-space. After the switching of the refocusing pulse, most often an entire k-space line is read out. Therefore, in terms of the method an entire k-space line is normally to be scanned multiple times (via multiple echo trains), and other k-space points of the same k-space line are to be scanned only once.

The echo trains according to the invention thereby in particular respectively acquire one or more k-space lines which are located in the middle segment of k-space.

Expressed differently, advantageously no echo trains exist for which MR data are acquired or k-space lines are filled only outside of the middle segment.

If each echo train acquires at least one k-space line in the middle segment, the k-space lines in the middle segment are read out frequently or more often than a k-space line outside of the middle segment. Since an incorrect k-space point in the center of k-space, for example, has a more optically pronounced effect than an incorrect k-space point at the edge of k-space, it is advantageous to more frequently acquire the k-space lines in the middle segment in order to annihilate movement artifacts, for example.

The middle segment thereby in particular comprises one or more k-space lines which all extend in the third direction, such that the middle segment has a length in the third direction which corresponds to the length of the scanned k-space in this third direction. A k-space line situated in the first direction at the edge of the middle segment thereby has a first distance from the edge of k-space. In a similar manner, a k-space line situated at the edge of the middle segment in the second direction has a second distance from the edge of k-space.

Expressed differently, the middle segment is advantageously located in the center of k-space. If the middle segment has the same length as k-space in the third direction, the middle axis of k-space which extends along the third direction through the middle of k-space lies in the middle of the middle segment. In most embodiments, the middle axis can thereby be viewed as an axis of symmetry of the middle segment.

In other words, the middle segment can be defined by the set of k-space lines and can have a rectangular (also quadratic) or quasi-circular cross section perpendicular to the third direction (the cross section is not really circular since the edge of the cross section is formed by k-space points), wherein an elliptical cross section is also possible. For example, the middle segment itself accordingly corresponds to a cuboid, effectively a cylinder or effectively a body with elliptical cross section which extends symmetrical to the middle axis of k-space.

Each of the echo trains advantageously respectively reads out a k-space line at the edge of k-space.

In other words, each echo train advantageously acquires at least two k-space lines, wherein one k-space line lies at the edge of k-space and another k-space line lies within the middle segment. Two different echo trains thereby normally do not acquire the same k-space line lying at the edge of k-space, which is why k-space lines situated at the edge are normally only scanned once.

According to an embodiment according to the invention, each echo train begins with the readout of a first k-space line at the edge of k-space and ends with a readout of a second k-space line which is likewise located at the edge of k-space. A straight line which connects the first k-space line with the second k-space line thereby traverses the middle segment.

According to this embodiment, each echo train begins with the readout of the first k-space line situated at the edge of k-space, then reads out additional k-space lines, wherein the echo train is prepared in the middle segment of k-space. In that the echo train reads out additional k-space lines, the echo train traverses the middle segment and ultimately ends with the readout of the second k-space line which is located at the opposite edge of scanned k-space relative to the first k-space line.

According to a further embodiment according to the invention, every echo train begins with a readout of a first k-space line at the edge of k-space and ends with a readout of a second k-space line which is located within the middle segment. According to a variant of this additional embodiment, each echo train begins with a readout of a first k-space line within the middle segment and ends with a readout of a second k-space line which is located at the edge of k-space.

In this further embodiment, each echo train connects the middle segment with the edge of scanned k-space.

According to another preferred embodiment according to the invention, scanned k-space is subdivided into multiple segments or regions. Each of these segments is thereby formed by one or more k-space lines which extend in the third direction, such that a length of each segment in this third direction corresponds to the length of scanned k-space in the third direction. A first segment thereby lies in the center of k-space. If N corresponds to the number of these segments and n is a natural number (for which N>n>0), it then applies that the (n+1)-th segment encloses the n-th segment. The second segment accordingly surrounds the first segment situated in the center, and the third segment surrounds the second segment etc. The k-space lines of the n-th segment are thereby more frequently read out in the middle than the k-space lines of the (n+1) segment.

Each of these segments can thereby be designed to be symmetrical relative to the middle axis of k-space. However, it is also possible that the segments are designed to be asymmetrical relative to the middle axis of k-space, which moreover also applies to the middle segment.

Like the middle segment, the segments can also have a rectangular (also quadratic), essentially circular or elliptical cross section.

Moreover, the k-space points are advantageously arranged equidistantly in k-space, meaning that the k-space points in particular have the same distance in each axial direction (x, y, z) from their nearest neighbors.

Expressed differently, a k-space line of a segment in the middle is scanned more frequently the closer that the corresponding segment lies to the center or the middle axis.

A homogenous sample set is considered advantageous, such that each k-space line of the same segment should be scanned identically often.

Within the scope of the present invention, a magnetic resonance system is also provided to acquire MR data in a predetermined three-dimensional volume segment within an examination subject. This magnetic resonance system has a basic field magnet, a gradient field system, one or more RF antennas, and a control device to control the gradient field system and the RF antenna(s), to receive the measurement signals which are acquired by the RF antenna(s), and to evaluate the measurement signals and to create the MR image data sets. The magnetic resonance system excites the three-dimensional volume segment with an RF excitation pulse and then implements the following in chronological order in order to acquire an echo train:

The magnetic resonance system switches a refocusing pulse.

The magnetic resonance system switches two phase coding gradients in a first direction and in a second direction.

The magnetic resonance system switches an additional magnetic field gradient which is situated perpendicular to the first direction and perpendicular to the second direction. Together with the two phase coding gradients, the additional magnetic field gradient serves for the spatial coding, wherein the MR data of a k-space line are read out by the magnetic resonance system while the additional magnetic field gradient is switched.

As in the method according to the invention, each k-space line corresponds to a line of k-space which corresponds with the volume segment. To acquire the MR data of the predetermined volume segment, the magnetic resonance system repeatedly reads at least one k-space line in a middle segment of k-space.

The advantages of the magnetic resonance system according to the invention essentially correspond to the advantages of the method according to the invention described above.

The above object also is achieved in accordance with the present invention by a non-transitory, computer-readable data storage medium encoded with programming instructions that, when the data storage medium is loaded into a computerized control and evaluation system of a magnetic resonance apparatus, caused the computerized control and evaluation system to operate the magnetic resonance apparatus to implement any of the above-described embodiments of the inventive method.

The electronically readable data medium can be, for example a DVD, a magnetic tape or a USB stick on which is stored electronically readable control information or commands, in the form of source code (C++, for example) that must still be compiled and linked or that must only be interpreted, or an executable software code that has only to be loaded into the corresponding computer or control device for execution.

The readout module of the pulse sequence according to the invention advantageously corresponds to a SPACE sequence, meaning that the acquisition of an echo train can take place with the SPACE sequence. Due to the variable flip angle and the long echo train lengths that are possible from these, the SPACE sequence exhibits certain advantages compared to the older TSE ("Turbo Spin Echo") and FSE ("Fast Spin Echo") sequences in practice.

The present invention has a better stability with regard to movement artifacts than is the case in comparable methods according to the prior art.

In particular, the present invention is suitable for reconstruction of MR images starting from acquired MR data of a three-dimensional volume segment. However, the present invention is naturally not limited to this preferred field of application since the present invention can, for example, also be used to acquire MR data which are not used for reconstruction of an MR image.

BRIEF DESCRIPTION OF THE DRAWINGS

FIG. 6 is a flowchart of an embodiment of a method according to the invention.

DESCRIPTION OF THE PREFERRED EMBODIMENTS

Figure 1:
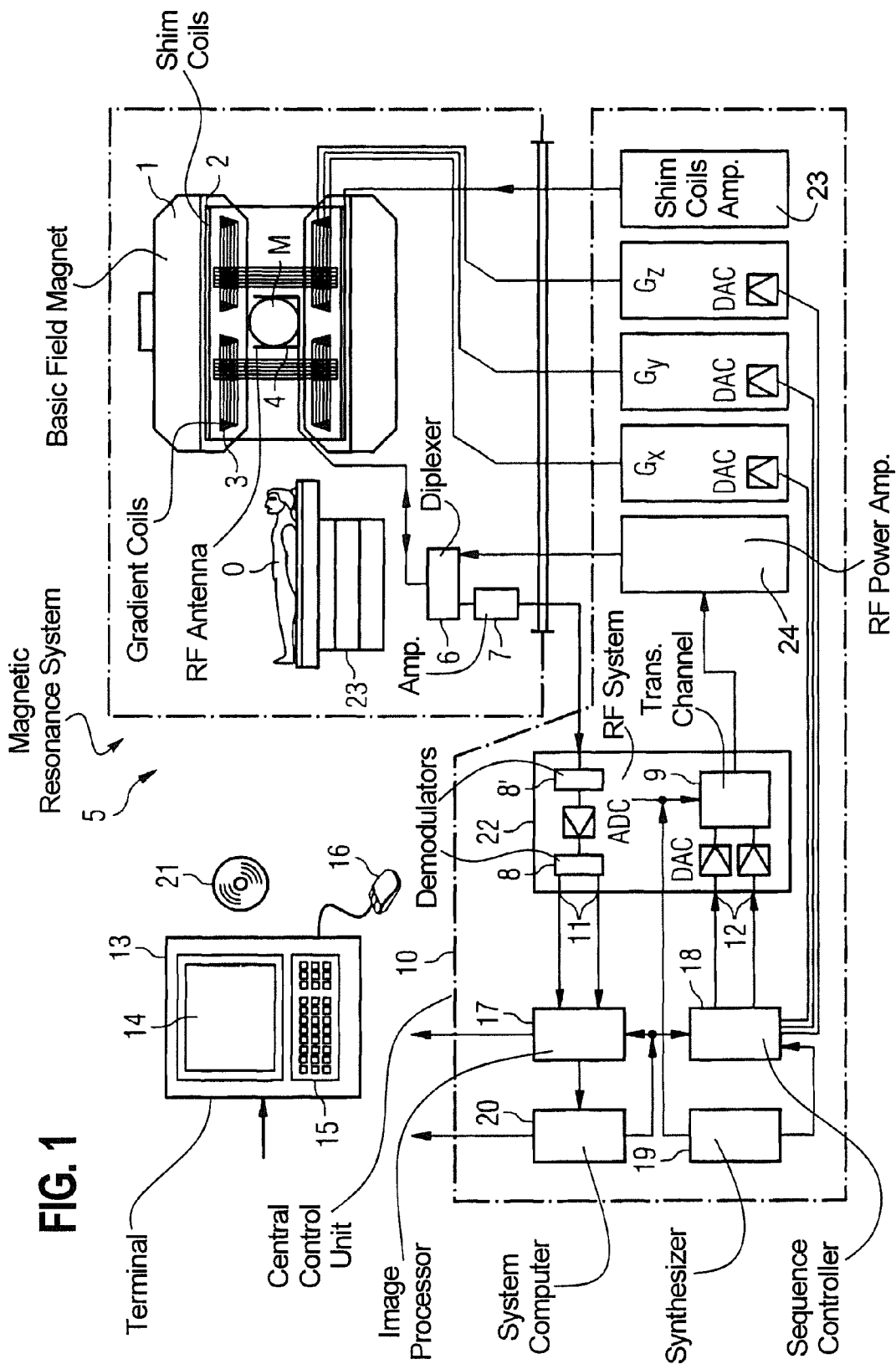
FIG. 1 shows a magnetic resonance system according to the invention.

FIG. 1 shows a schematic representation of a magnetic resonance system 5 (a magnetic resonance imaging or nuclear magnetic resonance tomography apparatus). A basic field magnet 1 generates a temporally constant, strong magnetic field for polarization or, respectively, alignment of the nuclear spins in a volume segment of a subject O, for example of a part of a human body that is to be examined which is examine on a table 23, situated in the magnetic resonance system 5. The high homogeneity of the basic magnetic field that is required for the magnetic resonance measurement (data acquisition) is defined in a typically spherical measurement volume M in which are arranged the parts of the human body that are to be examined. To support the homogeneity requirements, and in particular to eliminate temporally variable influences, shim plates made of ferromagnetic material are mounted at a suitable point. Temporally variable influences are eliminated by shim coils 2 operated by a shim coils supply 23.

A cylindrical gradient coil system 3 which comprises three sub-windings is used in the basic magnetic field 1. Each sub-winding is supplied by a corresponding amplifier with current to generate a linear (also temporally variable) gradient field in the respective direction of a Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. The amplifier has a digital/analog converter controlled by a sequence controller 18 for accurately-timed generation of gradient pulses.

Located within the gradient field system 3 is one (or more) radio-frequency antenna(s) 4 that convert the radio-frequency pulses emitted by a radio-frequency power amplifier into an alternating magnetic field to excite the nuclei and align the nuclear spins of the subject O to be examined or, respectively, of the region of the subject O that is to be examined. Each radio-frequency antenna 4 comprises one or more RF transmission coils and one or more RF reception coils in the form of an annular arrangement (advantageously linear or matrix-like) of component coils. The alternating field emanating from the precessing nuclear spins—i.e. normally the nuclear spin echo signals caused by a pulse sequence composed of one or more radio-frequency pulses and one or more gradient pulses—is also transduced by the RF reception coils of the respective radio-frequency antenna 4 into a voltage (measurement signal) which is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are represented digitally in the sequence controller 18 as a series of complex numbers based on a pulse sequence predetermined by the system computer 20. This number series is supplied as real part and imaginary part via respective inputs 12 to a digital/analog converter in the radio-frequency system 22, and from this to the transmission channel 9. In the transmission channel 9 the pulse sequences are modulated on a radio-frequency carrier signal whose base frequency corresponds to the center frequency.

The switch-over from transmission operation to reception operation takes place via a transmission/reception diplexer 6. The output of the transmission channel 9 is supplied to an RF power amplifier 24 that operates the RF transmission coils of the radio-frequency antenna(s) 4 so as to radiate(s) the radio-frequency pulses into the measurement volume M to excite the nuclear spins and samples resulting echo signals via the RF reception coils. The correspondingly acquired nuclear magnetic resonance signals (also called echo signals) are phase-sensitively demodulated at an intermediate frequency in a reception channel 8' (first demodulator) of the radio-frequency system 22 and are digitized in the analog/digital converter (ADC). This signal is further demodulated to a frequency of zero. The demodulation to a frequency of zero and the separation into real part and imaginary part occur after the digitization in the digital domain in a second demodulator 8. An MR image or, respectively, three-dimensional image data set is reconstructed by an image computer 17 from the measurement data acquired in such a manner. The administration of the measurement data, the image data and the control programs takes place via the system computer 20. Based on a specification with control programs, the sequence controller 18 controls the generation of the respective desired pulse sequences and the corresponding scanning of k-space. In particular, the sequence controller 18 controls the time-accurate switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an MR image (which is stored on a DVD 21, for example) and the presentation of the generated MR image take place via a terminal 13 that has a keyboard 15, a mouse 16 and a monitor 14.

Figure 2:
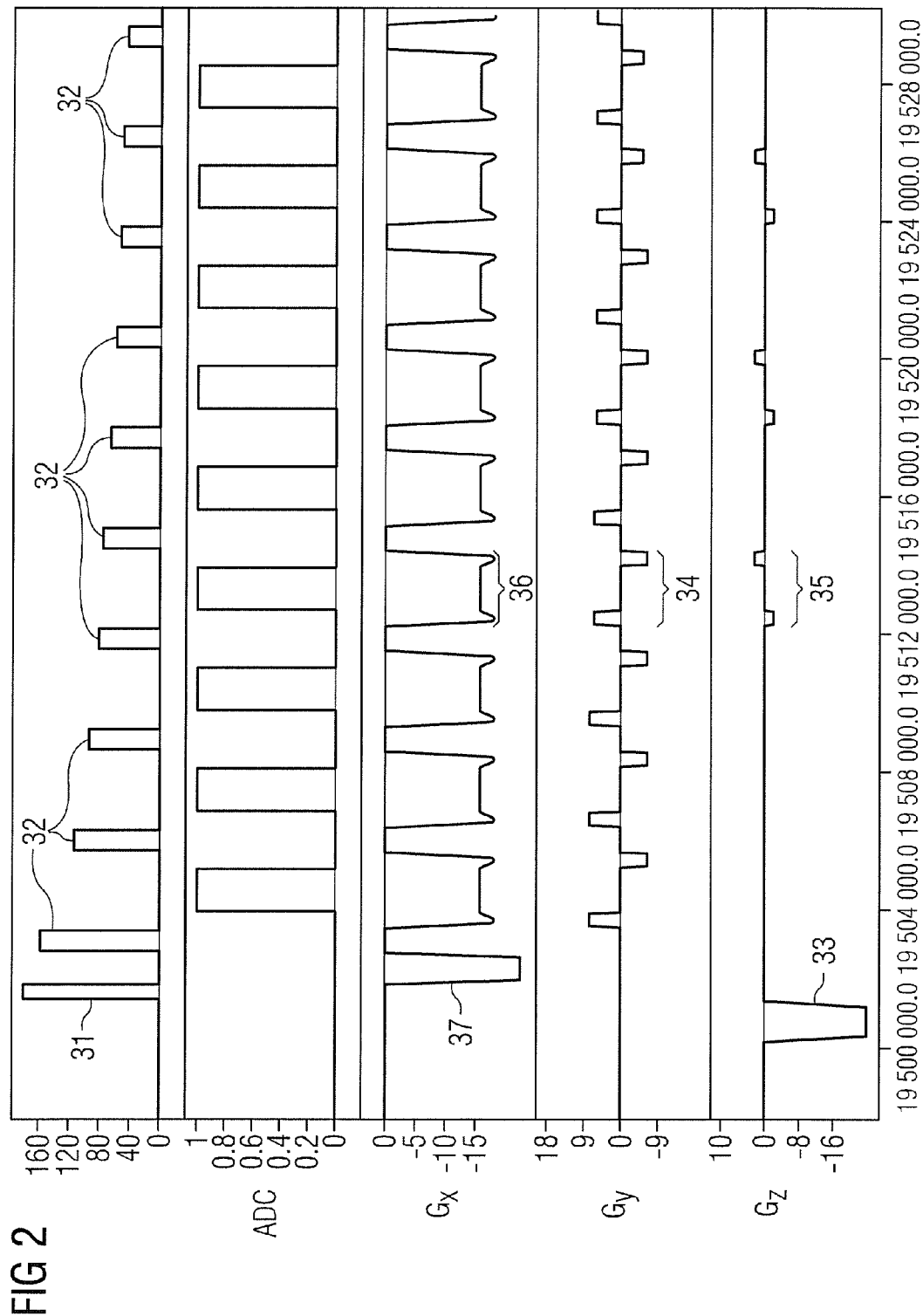
FIG. 2 shows a sequence according to the invention is shown for the acquisition of MR data within a three-dimensional volume.

A pulse sequence according to the invention is shown in FIG. 2. After a spoiler gradient 33 to destroy "old" magnetization, an RF excitation pulse 31 is switched in order to excite the spins within the predetermined three-dimensional volume segment. The gradient pulse 37 switched in the direction of the x-axis serves to prepare the magnetization before the readout in that the magnetization is dephased before the following refocusing pulse 32.

The MR data are subsequently read out in k-space (wherein k-space corresponds to the volume segment). To read out a k-space line in the x-direction, a respective refocusing pulse 32 is switched which follows a gradient pulse 34 in the y-direction and a gradient pulse 35 in the z-direction. These two gradient pulses or phase coding gradients 34 and 35 serve for the phase coding. With these two phase coding gradients 34 and 35 a k-space line is read out, wherein for this a magnetic field gradient 36 is switched in the direction of the x-axis. ADC ("analog/digital conversion") specifies in what time intervals the MR data are acquired and digitized.

After a switching of the RF excitation pulse 31 that takes place only once, 120 or more non-selective refocusing pulses 32 (and therefore 120 or more k-space lines) can be read out if the flip angle of the non-selective refocusing pulses 32 is varied accordingly. The shown sequence diagram can correspond to a SPACE sequence.

Figure 3:
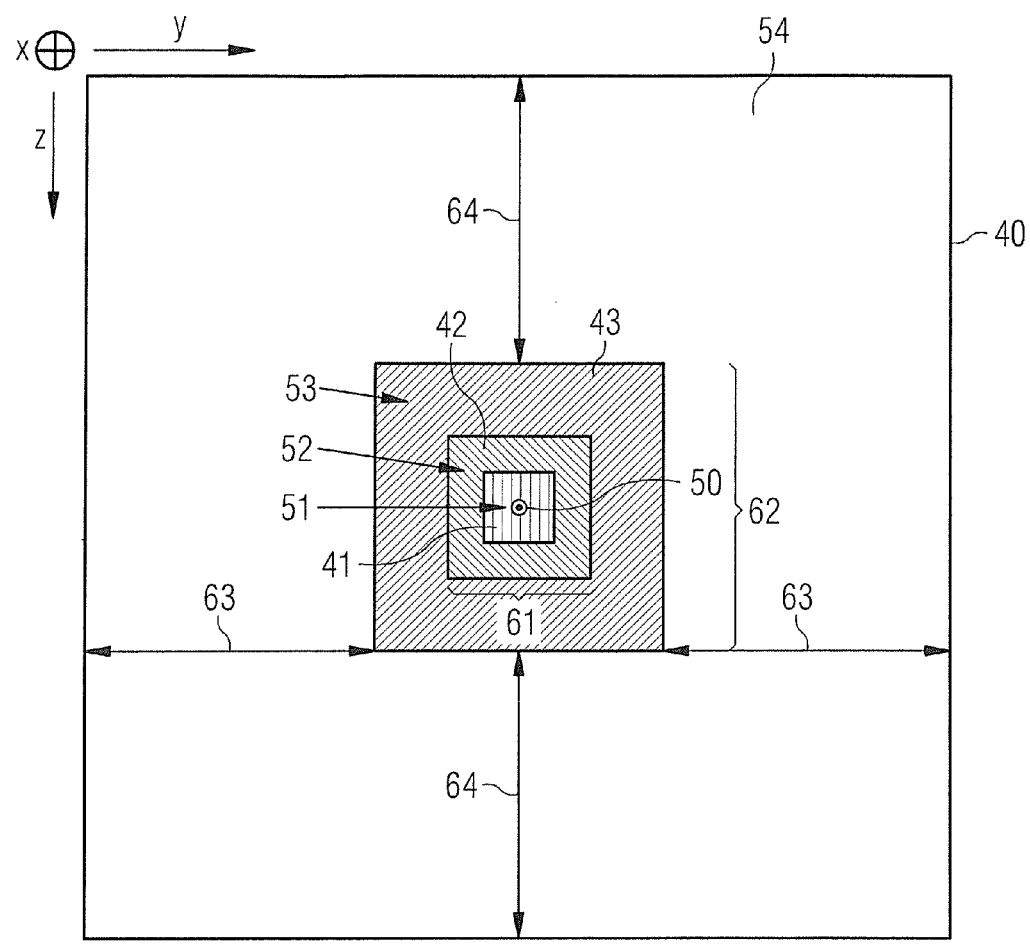
FIG. 3 shows a division according to an embodiment of the invention of scanned k-space into segments whose k-space lines are scanned with different frequencies.

The division of scanned k-space 40 into different regions 51-54 is shown in FIG. 3, wherein k-space lines of the individual regions 51-54 are scanned with different frequencies. Each region 51-54 is defined by its own k-space lines which extend along the x-direction. The length of each region 51-54 in the x-direction accordingly corresponds to the length of scanned k-space 40 in this direction.

The first region 51 corresponds to a cuboid and is symmetrical to an axis of symmetry or middle axis 50 of k-space 40 which extends along the x-direction. The second region 52 surrounds the first region 51, as the third region 52 also surrounds the second region 52 and the fourth region 54 surrounds the third region 53.

Expressed differently, scanned k-space 40 is subdivided into different volume segments 41-43, with the first segment 41 situated in the middle corresponding to the first region 51. The second segment 42 includes the first segment 41, has a cuboid shape, and is symmetrical relative to the middle axis 50. In a similar manner, the third segment 43 includes the second segment 42 (and therefore the first segment 41 as well), has a cuboid shape, and is likewise symmetrical relative to the middle axis 50. The second region 52 accordingly corresponds to the difference of the second segment 42 minus the first segment 41 (the k-space lines of the second segment 42 which are not simultaneously k-space lines of the first segment 41 are the k-space lines of the second region 52). In a similar manner, the third region 53 corresponds to the difference of the third segment 43 minus the second segment (the k-space lines of the third segment 43 which are not simultaneously k-space lines of the second segment 42 are the k-space lines of the third region 53). Finally, the fourth region 54 corresponds to the difference of scanned k-space 40 minus the third segment 43 (the k-space lines of scanned k-space 40 which are not simultaneously k-space lines of the third segment 43 are the k-space lines of the fourth region 54).

In the shown embodiment, the k-space lines of the middle first region 51 are respectively acquired eight times, the k-space lines of the second region 52 are respectively acquired four times, the k-space lines of the third region 53 are respectively acquired twice, and the remaining k-space lines (i.e. the k-space lines of the fourth region 54) are each acquired once. It is also possible for the first region 51 situated in the center to include only one k-space line which, in this example, is scanned eight times.

In the embodiment shown in FIG. 3, the cross section (perpendicular to the x-direction) of the volume segments 41-43 is quadratic, such that the distance 63, 64 from the edge of the third segment 43 to the edge of scanned k-space 40 is of equal size both in the y-direction and in the z-direction.

As is presented as an example in FIG. 3, in cross section along the y-direction and z-direction the second segment 42 has dimensions 61 which correspond to 15% of the dimensions of scanned k-space 40 in the y/z-plane. In a similar manner, in cross section along the y-direction and z-direction the third segment 43 has dimensions 62 which correspond to 25% of the dimensions of k-space 40 in the y/z-plane.

While the k-space lines outside of the third segment 43 are only scanned once, the k-space lines within the third segment 43 are scanned at least twice. The third segment 43 therefore corresponds to the middle segment that has been mentioned repeatedly in the preceding, which is characterized in that its k-space lines are scanned repeatedly.

Figure 4:
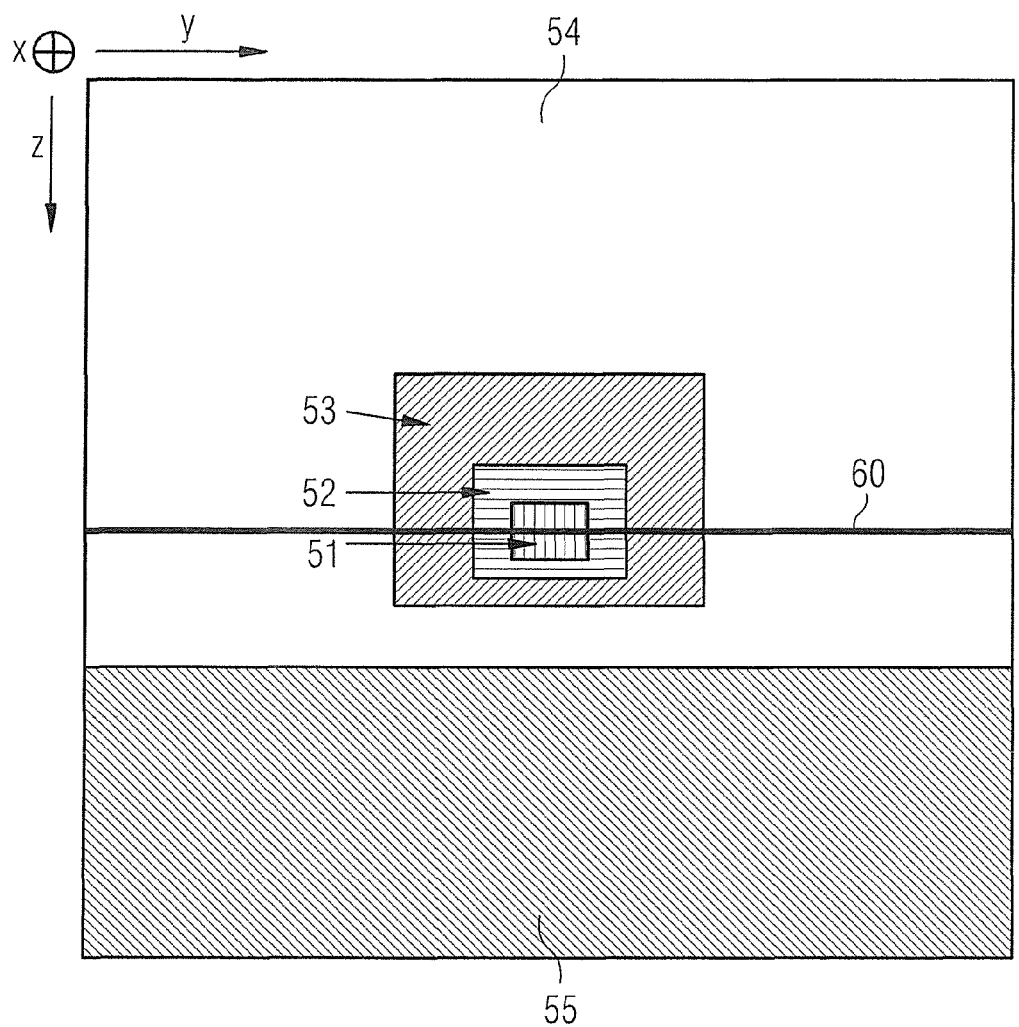
FIG. 4 shows a division according to a further embodiment of the invention of scanned k-space into segments whose k-space lines are scanned with different frequencies.

While in FIG. 3 the regions 51-54 are arranged symmetrically relative to the middle axis 50, this is not the case in FIG. 4. FIG. 4 shows a separation of scanned k-space into various regions 51-55, which is similar at least to the principle according to the invention of the division of FIG. 3. However, the regions 51-55 are arranged asymmetrical to the middle axis 50 of k-space, which is clear due to the position of the individual regions 51-55 at the line of symmetry 69 relative to the k-space middle.

Moreover, in the embodiment presented in FIG. 4 the region 55 exists in which no MR data are acquired, whereby in comparison to the embodiment depicted in FIG. 3 acquisition time is saved since fewer MR data are to be acquired. The absence of the MR data from the region 55 can be compensated via what are known as zero filling methods or via partial Fourier methods or, respectively, half Fourier methods.

It is apparent that in FIG. 4—in comparison to FIG. 3—the cross sections of the volume segment are also not quadratic but rather are rectangular. Moreover, the distance from the edge of a segment to the edge of k-space in FIG. 4 is also not the same along the z-direction (top and bottom in FIG. 4).

It is noted that embodiments according to the invention also exist in which the distances from the edge of a segment to the edge of k-space are unequal in size along the y-direction (right and left in FIGS. 3 and 4).

In the embodiment shown in FIG. 4, the k-space lines of the central first region 51 are also respectively acquired eight times; the k-space lines of the second region 52 are respectively acquired four times; the k-space lines of the third region 53 are respectively acquired twice; and the k-space lines of the fourth region 54 are each acquired once, while in the fifth region 55 no MR data are acquired.

Figure 5:
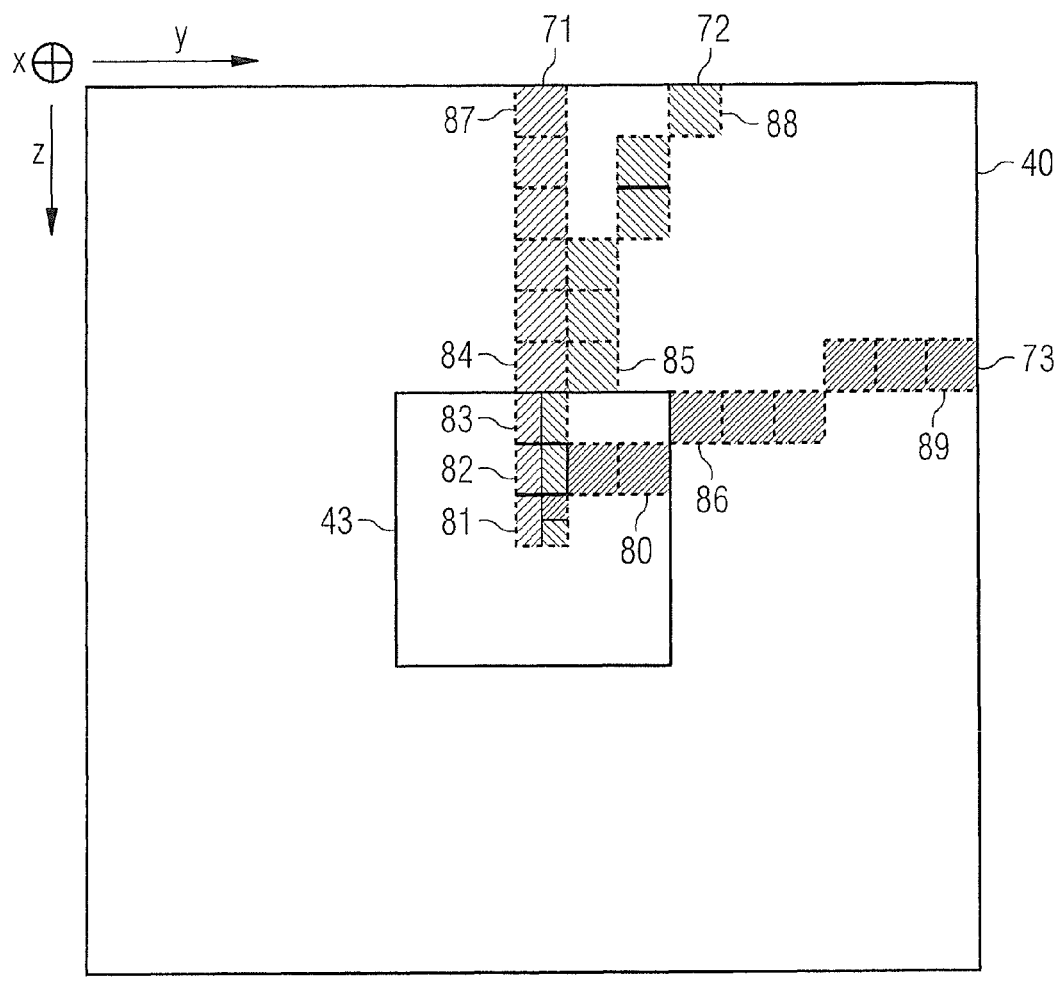
FIG. 5 shows a division of k-space in an embodiment of the invention with three pulse trains.

Three echo trains 71-73 are shown in FIG. 5. In this example, each echo train 71-73 comprises nine k-space lines 80-89. Each echo train 71-73 thereby begins/ends with a k-space line 87-89 at the edge of scanned k-space 40 and ends/begins with the same k-space line 81 in the center. It is apparent that each k-space line 80-89 of an echo train 71-73 is directly adjacent to another k-space line of the same echo train 71-73.

Outside of the middle segment 43, the echo trains 71-73 have no intersection set so that each k-space line 84-89 is scanned only once outside of the middle segment 43. In contrast to this, the echo trains 71-73 have intersection sets within the middle segment. For example, the k-space lines 82, 83 are scanned by both the echo train 71 and by the echo train 72, and the k-space line 81 is scanned by all three shown echo trains 71-73. Expressed in a different way, the k-space lines 82, 83 are scanned twice and the k-space line 81 is scanned three times.

It is noted that the echo trains 71-73 shown in FIG. 5 represent only a small excerpt of the echo trains which would be used according to the invention to scan the entirety of k-space 40.

A flowchart of a method according to the invention is depicted in FIG. 6.

In the first Step S1, an RF excitation pulse is switched to excite the three-dimensional volume segment. This RF excitation pulse can be selective (meaning that it excites precisely the three-dimensional volume segment to be acquired) or it can be non-selective (meaning that it excites a larger volume in which the three-dimensional volume segment is located.

A non-selective RF refocusing pulse is switched in the second Step S2 to read out an echo train. In the third step S3, two phase coding gradients are subsequently switched, and in the fourth Step S4 a k-space line is read out given a switched frequency coding gradient. Steps S2 through S4 are repeated 120 times, for example, until the echo train has been acquired completely, which is checked via the query S5. If the echo train has been acquired completely (yes at query S5), the method branches to the query S6 in which a check is made as to whether all echo trains have been acquired, and therefore whether k-space has been completely read out. If this is not the case (no at query S6), the method jumps back to the first Step S1 in which an additional RF excitation pulse is switched. Only if all echo trains have been acquired (and therefore that k-space has been read out completely; yes at query S6), the method ends.

Although modifications and changes may be suggested by those skilled in the art, it is the intention of the inventors to embody within the patent warranted hereon all changes and modifications as reasonably and properly come within the scope of their contributions to the art.

We claim as our invention:

1. A method to acquire magnetic resonance (MR) data from a predetermined three-dimensional volume segment of an examination subject, comprising:
    operating an MR data acquisition unit to radiate a radio-frequency (RF) excitation pulse that excites nuclear spins in said predetermined three-dimensional volume segment of the examination subject, and causes said nuclear spins to generate an echo train; and
    operating said MR data acquisition unit to repeatedly implement the following steps in chronological succession in order to read out an echo train by acquiring respective data values and entering said data values at respective points of k-space comprising k-space lines in a memory, wherein all lines in k-space correspond to said volume segment:
        activate a refocusing pulse,
        activate a first phase coding gradient in a first direction and a second phase coding gradient in a second direction, and
        activate an additional magnetic field gradient in a third direction that is perpendicular to each of said first direction and said second direction, and reading out said data values in a k-space line while said additional magnetic field gradient is activated, causing k-space points of at least one k-space line in a middle segment of k-space to be repeatedly read out.

2. A method as claimed in claim 1 comprising causing all k-space points in said at least one k-space line of said middle segment of k-space to be repeatedly read out.

3. A method as claimed in claim 1 comprising operating said MR data acquisition unit to generate multiple echo trains, and respectively reading out said multiple echo trains in respective k-space lines that proceed through said middle segment of k-space.

4. A method as claimed in claim 1 comprising selecting said middle segment of k-space to extend in said third direction by a length that corresponds to a length of scanned k-space in said third direction, with an outermost k-space line of said middle segment in said first direction having a predetermined first distance from a peripheral edge of k-space, and an outermost k-space line of said middle segment in said second direction having a predetermined second distance from said peripheral edge of k-space.

5. A method as claimed in claim 1 comprising reading out each echo train by entering data values into a k-space line at a peripheral edge of k-space.

6. A method as claimed in claim 1 comprising beginning read out of each echo train with a read out of a k-space line at a peripheral edge of k-space and ending read out of each echo train with an additional k-space line at said peripheral edge of k-space, with a straight line that connects a middle point of said k-space line and a middle point of said additional k-space line proceeding through said middle segment of k-space.

7. A method as claimed in claim 1 comprising beginning read out of each echo train with read out of a k-space line at a peripheral edge of k-space and ending read out of each echo train with read out of an additional k-space line in said middle segment of k-space, and beginning read out of each echo train with read out of a k-space line at an edge of said middle segment of k-space and ending read out of every echo train with read out of an additional k-space line at said peripheral edge of k-space.

8. A method as claimed in claim 1 comprising subdividing k-space into multiple segments, that includes said middle segment, and forming each of said segments by at least one k-space line that extends in said third direction, with a length of each segment in said third direction corresponding to a link of scanned k-space in said third direction, with a first of said segments being in said center of k-space and an $(n+1)^{th}$ segment surrounding an $n^{th}$ segment, with k-space lines of said $n^{th}$ segment being read out more frequently than k-space lines of said $(n+1)^{th}$ segment.

9. A method as claimed in claim 8 wherein each segment is symmetrical relative to a middle axis of k-space along said third direction.

10. A method as claimed in claim 8 comprising scanning each k-space line of said $n^{th}$ segment a same number of times.

11. A method as claimed in claim 1 comprising averaging the data values of the respective k-space points that are read out repeatedly in order to generate MR data for the respective k-space points for use in generating a magnetic resonance image of said volume of said subject.

12. A magnetic resonance (MR) apparatus comprising:
    an MR data acquisition unit;
    a control unit configured to operate said MR data acquisition unit to radiate a radio-frequency (RF) excitation pulse that excites nuclear spins in said predetermined three-dimensional volume segment of the examination subject, and causes said nuclear spins to generate an echo train; and
    said control unit configured to operate said MR data acquisition unit to repeatedly implement the following steps in chronological succession in order to read out an echo train by acquiring respective data values and entering said data values at respective points of k-space comprising k-space lines in a memory, wherein all lines in k-space correspond to said volume segment:
        activate a refocusing pulse,
        activate a first phase coding gradient in a first direction and a second phase coding gradient in a second direction, and
        activate an additional magnetic field gradient in a third direction that is perpendicular to each of said first direction and said second direction, and reading out said data values in a k-space line while said additional magnetic field gradient is activated, causing k-space points of at least one k-space line in a middle segment of k-space to be repeatedly read out.

13. A non-transitory, computer-readable data storage medium encoded with programming instructions, said data storage medium being loaded into a computerized control unit of a magnetic resonance (MR) apparatus that comprises an MR data acquisition unit, said programming instructions causing said computerized control unit to:
    operate said MR data acquisition unit to radiate a radio-frequency (RF) excitation pulse that excites nuclear spins in said predetermined three-dimensional volume segment of the examination subject, and causes said nuclear spins to generate an echo train; and operate said MR data acquisition unit to repeatedly implement the following steps in chronological succession in order to read out an echo train by acquiring respective data values and entering said data values at respective points of k-space comprising k-space lines in a memory, wherein all lines in k-space correspond to said volume segment:

activate a refocusing pulse, activate a first phase coding gradient in a first direction and a second phase coding gradient in a second direction, and activate an additional magnetic field gradient in a third direction that is perpendicular to each of said first direction and said second direction, and reading out said data values in a k-space line while said additional magnetic field gradient is activated, causing k-space points of at least one k-space line in a middle segment of k-space to be repeatedly read out.

* * * * *